(12) United States Patent
Ma et al.

(10) Patent No.: US 9,617,148 B2
(45) Date of Patent: Apr. 11, 2017

(54) INTERPOSER FOR HERMETIC SEALING OF SENSOR CHIPS AND FOR THEIR INTEGRATION WITH INTEGRATED CIRCUIT CHIPS

(71) Applicant: Intel Corporation, Santa Clara, CA (US)

(72) Inventors: Qing Ma, Saratoga, CA (US); Johanna M. Swan, Scottsdale, AZ (US); Min Tao, Tempe, AZ (US); Charles A. Gealer, Phoenix, AZ (US); Edward T. Zarbock, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/176,467

(22) Filed: Jun. 8, 2016

(65) Prior Publication Data

US 2016/0280539 A1    Sep. 29, 2016

Related U.S. Application Data

(60) Division of application No. 13/631,744, filed on Sep. 28, 2012, now Pat. No. 9,368,429, which is a
(Continued)

(51) Int. Cl.
*H01L 21/00* (2006.01)
*B81C 1/00* (2006.01)
(Continued)

(52) U.S. Cl.
CPC .......... *B81C 1/00301* (2013.01); *B81B 7/007* (2013.01); *B81C 1/00238* (2013.01);
(Continued)

(58) Field of Classification Search
CPC ....... H01L 2924/1461; H01L 23/49816; H01L 23/5384; B81B 2207/012
See application file for complete search history.

(56) References Cited

U.S. PATENT DOCUMENTS

| 5,523,608 A | 6/1996 | Kitaoka et al. |
| 5,948,991 A | 9/1999 | Nomura et al. |
(Continued)

OTHER PUBLICATIONS

PCT/US2011/057742 Notification Concerning Transmittal of International Preliminary Report on Patentability, mailed May 8, 2014, 7 pages.
(Continued)

*Primary Examiner* — Zandra Smith
*Assistant Examiner* — John M Parker
(74) *Attorney, Agent, or Firm* — Blakely, Sokoloff, Taylor & Zafman LLP

(57) ABSTRACT

Integration of sensor chips with integrated circuit (IC) chips. At least a first sensor chip including a first sensor is affixed to a first side of an interposer to hermetically seal the first sensor within a first cavity. An IC chip is affixed to a second side of the interposer opposite the first sensor, the IC chip is electrically coupled to the first sensor by a through via in the interposer. In embodiments, the first sensor includes a MEMS device and the IC chip comprises a circuit to amplify a signal from the MEMS device. The interposer may be made of glass, with the first sensor chip and the IC chip flip-chip bonded to the interposer by compression or solder. Lateral interconnect traces provide I/O between the devices on the interposer and/or a PCB upon which the interpose is affixed.

8 Claims, 11 Drawing Sheets

Related U.S. Application Data continuation of application No. PCT/US2011/057742, filed on Oct. 25, 2011.

(51) Int. Cl.

| | |
|---|---|
| *H01L 23/48* | (2006.01) |
| *H01L 23/00* | (2006.01) |
| *G01P 15/08* | (2006.01) |
| *B81B 7/00* | (2006.01) |
| *H01L 25/065* | (2006.01) |
| *H01L 23/498* | (2006.01) |
| *H01L 23/538* | (2006.01) |

(52) U.S. Cl.
CPC ........ *G01P 15/0802* (2013.01); *H01L 23/481* (2013.01); *H01L 24/03* (2013.01); *B81C 2203/0145* (2013.01); *H01L 23/49816* (2013.01); *H01L 23/5384* (2013.01); *H01L 25/0652* (2013.01); *H01L 2224/0401* (2013.01); *H01L 2224/131* (2013.01); *H01L 2224/16225* (2013.01); *H01L 2224/16227* (2013.01); *H01L 2224/73204* (2013.01); *H01L 2924/01327* (2013.01); *H01L 2924/07811* (2013.01); *H01L 2924/12042* (2013.01); *H01L 2924/1461* (2013.01)

(56) References Cited

U.S. PATENT DOCUMENTS

| | | | | |
|---|---|---|---|---|
| 6,137,164 | A * | 10/2000 | Yew | H01L 23/49816 257/686 |
| 7,518,229 | B2 * | 4/2009 | Cotte | H01L 23/66 257/685 |
| 2003/0122206 | A1 * | 7/2003 | Bhattarai | B81B 7/04 257/415 |
| 2005/0073017 | A1 * | 4/2005 | Kim | H01L 27/14618 257/433 |
| 2005/0205950 | A1 | 9/2005 | Kondo et al. | |
| 2008/0070000 | A1 * | 3/2008 | Suzuki | H01L 23/057 428/138 |
| 2009/0194829 | A1 | 8/2009 | Chung et al. | |
| 2012/0217287 | A1 * | 8/2012 | Kumar | B23K 1/0016 228/178 |
| 2012/0274647 | A1 * | 11/2012 | Lan | H03H 3/0072 345/531 |

OTHER PUBLICATIONS

Taiwan IPO Search Report with English translation from Taiwan Patent Application 105122066, dated Oct. 28, 2016, 2 pages.

* cited by examiner

803

```
┌─────────────────────────────────────────────────────────────────┐
│ Join bond pads of the interposer to bond pads of the each of the plurality │
│   of sensor chips with a first solder joint at a first soldering temperature │
│                              822                                │
└─────────────────────────────────────────────────────────────────┘
                                 │
                                 ▼
┌─────────────────────────────────────────────────────────────────┐
│  Join bond pads of the interposer to bond pads of IC chip with a second │
│ solder joint at a second soldering temperature which does not cause the │
│                    first solder joint to reflow                 │
│                              852                                │
└─────────────────────────────────────────────────────────────────┘
                                 │
                                 ▼
                       (   Return to 895   )
```

FIG. 8C

INTERPOSER FOR HERMETIC SEALING OF SENSOR CHIPS AND FOR THEIR INTEGRATION WITH INTEGRATED CIRCUIT CHIPS

CLAIM OF PRIORITY

This application is a Divisional application of co-pending U.S. patent application Ser. No. 13/631,744, titled "Interposer for Hermetic Sealing of Sensor Chips and for Their Integration with Integrated Circuit Chips," filed on Sep. 28, 2012, which is a Continuation of International Application No. PCT/US2011/057742, filed on Oct. 25, 2011, the entire contents of which are incorporated herein by reference in their entirety.

TECHNICAL FIELD

Embodiments of the present invention are generally in the field of microelectronic packaging, and more specifically relate to package level integration of sensors with integrated circuits (ICs).

BACKGROUND

Many techniques are employed to integrate sensors, such as accelerometers, gyros, and the like, with IC chips, such as those employed to condition and/or process the signals generated by the sensors. While monolithic integration of sensors and IC has been done in certain applications, monolithic integration is an expensive option typically requiring a sensor to be fabricated on top of an already complicated IC stack. As the complexity of ICs and sensors continues to increase, monolithic solutions become less attractive because of cost and the intimate association of the IC with the sensor limits a product portfolio's flexibility/diversity.

Board-level integration is another technique in which packaged sensor chips and packaged IC chips are placed onto a printed circuit board (PCB). At this level of integration, there is little difference between a sensor chip and an IC chip, so assembly techniques are advantageously straight forward, however a major disadvantage of board-level integration is the significant increase in size incurred through the many packaged devices. Each package typically includes an organic package substrate that has been built up to millimeters in thickness and an encapsulant increases chip lateral chip dimensions as well. Pick and place tool alignment limitations further limit the packing density of devices during PCB assembly.

Package-level integration is a third technique which falls somewhere between the monolithic and board-level integration techniques. Package-level integration generally entails bonding a plurality of chips onto a single organic package substrate. FIG. 1 is a cross-sectional illustration of an integrated package 100 including sensor chip 108 and an IC 109 affixed to an organic package substrate 120 having a core 125 with build-up layers 130, 131 in which interconnect traces 135 are embedded. For package-level integration, differences between sensor chips and IC chips become apparent. For example, while the IC 109 is often flip-chip bonded to the organic package substrate 120, the sensor chip 108 typically cannot be flip-chip bonded because the sensor chip 108, as received from a sensor supplier, has a ceramic cap 110 providing protection and hermetic sealing the sensor 105 within a cavity 207. As such, to provide electrical connections 116 between the sensor 105 and the organic package substrate 120, a through silicon via (TSV) 115 is formed through the silicon substrate 101. TSVs however, are difficult to form and therefore expensive. Another problem faced by package-level integration is that the thickness of the organic package substrate 120 is considerable so that with chips 108, 109 affixed to one side of the organic package substrate 120, the thickness T1 is on the order of 500 µm, or more. If additional devices are affixed to a second side of the organic package substrate 120, the thickness increases even more. As such, even where the integrated package 100 is bonded to a PCB (e.g., with solder bump 140), the integrated package 100 requires considerably more physical space than if monolithically integrated. Not only does this greater physical size limit the form factor of the end-user device, performance of the sensor may be reduced relative to a monolithic implementation because of the greater interconnect trace lengths between the sensor 105 and the IC chip 109.

As such, techniques for integrating sensors and IC chips and there resulting structures which overcome the aforementioned limitations of the conventional techniques are advantageous.

BRIEF DESCRIPTION OF THE DRAWINGS

Embodiments of the present invention are illustrated by way of example, and not by way of limitation, and can be more fully understood with reference to the following detailed description when considered in connection with the figures in which:

FIGS. 7 and 8A-8C are flow diagrams illustrating methods of integrating sensor chips and IC chips on an interposer, in accordance with embodiments of the present invention.

DETAILED DESCRIPTION

Figure 1:
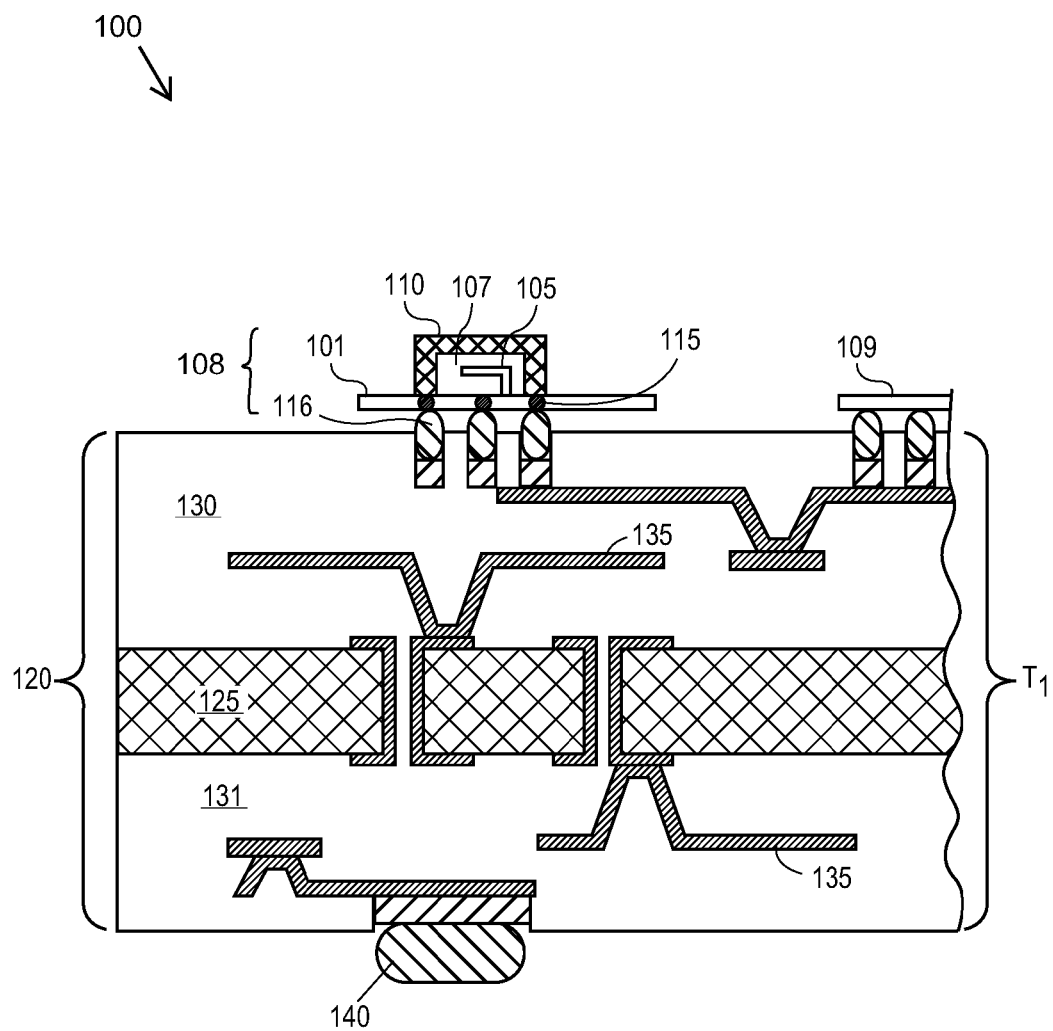
FIG. 1 is a cross-sectional illustration of a sensor chip integrated with an IC chip with a conventional package-level technique.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer.

Embodiments of the present invention employ an interposer to hermetically seal a sensor within a cavity and to provide a point of physical and electrical coupling of a sensor chip and an IC chip. While the following description makes many technical advantages apparent to the skilled reader, an advantage of the interposer of initial note is that multiple sensor chips may be mounted to the same interposer so that a hermetic seal is provided for all sensor chips, regardless of their function or source of supply. Another notable advantage of the interposer is that an IC chip may be mounted on a side opposite that to which a sensor chip is mount with a though via electrically coupling the two for an interconnect length that is much closer to that of monolithic integration. Another advantage is a low material cost for the interposer and low cost to form the through vias, relative to a silicon substrate and TSV. While these advantages all contribute to reduced physical size, embodiments where the interposer is mounted directly to a PCB enjoy a further reduction in physical dimension by eliminating any organic packaging substrate. Another notable advantage is that lateral interconnect traces may be formed on the interposer at low cost to provide I/O to the various chips affixed to the interposer and between the interposer and the PCB.

Figure 2:
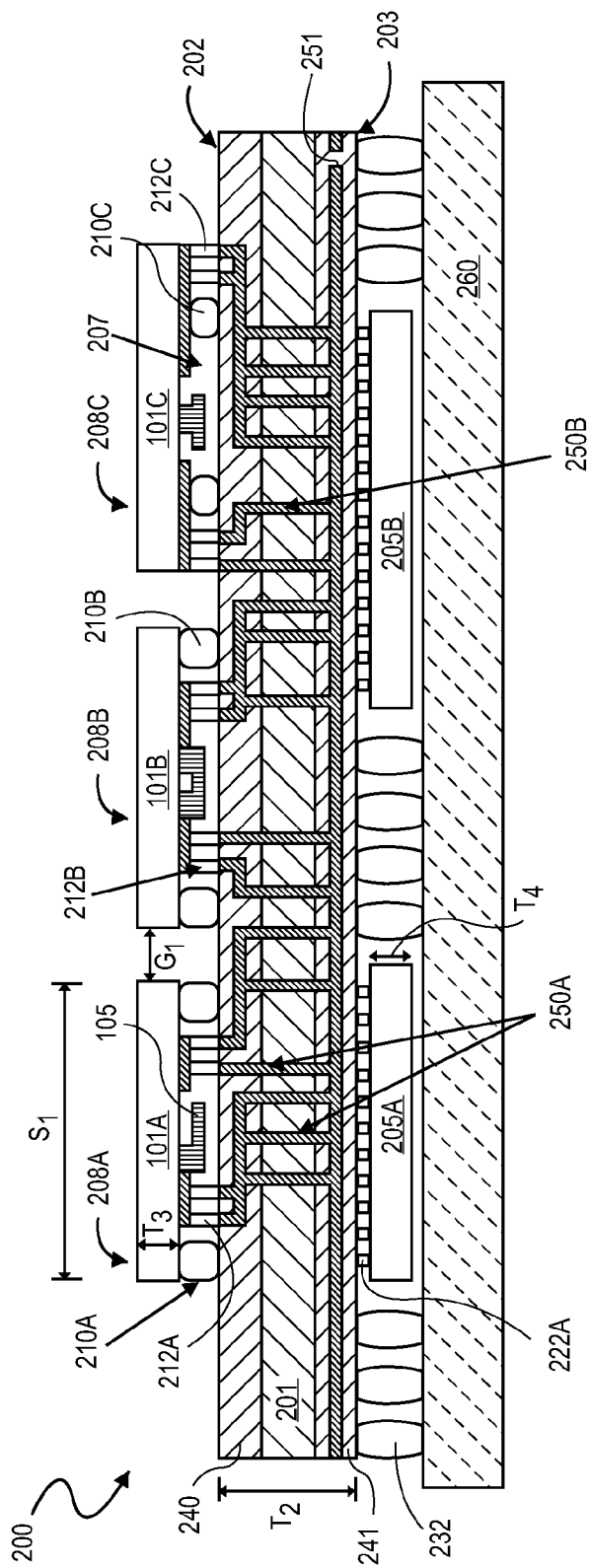
FIG. 2 is a cross-sectional illustration of an integrated microelectronic device integrating sensor chips and IC chips on an interposer, in accordance with an embodiment of the present invention.

FIG. 2 is a cross-sectional illustration of an exemplary system 200 integrating first and second IC chips 205A, 205B with first, second, and third sensor chips 208A, 208B, 208C on an interposer 201, in accordance with an embodiment of the present invention. Generally, the sensor and IC chips are affixed to both sides of the interposer 201. In the illustrative embodiment, the first sensor chip 208A, disposed on a first substrate, is affixed to a first side 202 of the interposer 201 and the IC chip 205A, disposed on a second substrate, is affixed to a second side 203 of the interposer 201 by flip chip (C4) connections 222A. As such, expensive TSVs are not need through a substrate of the IC chip 205A or a substrate of the first sensor chip 208A.

While the IC chips affixed to the interposer 201 may be any analog, digital, or mixed signal circuitry known in the art for control of the sensor chips 208A, 208B, and/or 208C or for processing of their signals, in the exemplary embodiment the fist IC chip 205A has a function correspondence with the sensor chip disposed most opposite to the IC chip. For example, first IC chip 205A has a functional correspondence with the first sensor chip 208A, while the second IC chip 205B has a functional correspondence with the second and third sensor chips 208B, 208C. In one such embodiment, the first IC chip 205A includes an amplifier circuit to amplify a signal received from the first sensor chip 208A (i.e., as generated by sensor 105). As the sensor 105 may provide a signal with relatively low signal-to-noise ratio (SNR), it is advantageous to conduct the sensor I/O to the first IC chip 205A by the through via 250A for minimal signal loss and cross-talk. In the illustrated embodiment, the first sensor chip 208A and first IC chip 205A are approximately aligned across a thickness of the interposer permitting electrical coupling of the two with through via interconnect 250A that is of minimum length as defined essentially by the interposer thickness T2. In a further embodiment, the interposer thickness T2 is less than a lateral pitch between devices placed on a same side of the interposer (e.g., side 202), so that the though via 250A minimizes interconnect trace length between an amplifier circuit and the sensor 105. For example, depending on the material chosen for the interposer 201 and whether an additional package substrate is to be utilized, the interposer thickness T2 may range from between about 100 µm and about 500 µm while the sensor chip lateral side dimension S1 may range for 1 mm-2 mm, or more, with the lateral gap between adjacent devices G1 anywhere from 200 µm to 1 mm. In another embodiment illustrated by FIG. 2, the second IC chip 205A is coupled to both the second and third sensor chips 208B and 208C to send input signals to one of the second and third sensor chips 208B, 208C based on a output signal received from the other of the second and third sensor chips 208B, 208C. With through vias 250B routing to both the second and third sensor chips 208B, 208C, the three chips 205B, 208B and 208C may be closely placed and intimately associated at a level rivaling monolithic integration without the concomitant costs and loss of device-level flexibility.

As further shown in FIG. 2, the first sensor chip 208A includes a sensor chip substrate 101A and is affixed to the interposer 201 with a hermetic seal 210A between the sensor chip substrate 101A and the interposer 201 enclosing the sensor 105 within the cavity 207. As such, the sensor chip 208A is essentially flip-chip bonded to bond pads on the interposer 201 with the interposer 201 forming a hermetic cap material covering the sensor 105. Depending on the sensor chip lateral side dimension 51 and the tolerance of the sensor 105 to contamination, electrical connections between the sensor and the through vias are within the hermetic cavity (e.g., connections 212A and through vias 250A) or electrical connections between the sensor and the through vias are disposed outside of the hermetic seal (e.g., connections 212C and though vias 250B) to maintain the cavity 207 solder-free. With the electrical connections 212A being on a same side of the sensor chip 208A as the sensor 105, there is no need to form a TSV through the sensor substrate 101A, which is typically of silicon having a 50-500 µm thickness.

The second and third sensor chips 208B, 208C disposed on second and third substrates 101B, 101C, are also affixed to the first side 202 of the interposer 201. Although second and third sensor chips 208B, 208C may alternatively be affixed to the second side 203 of the interposer 201, as describe elsewhere herein, sealing a plurality of sensor chips may be relatively easier where all the sensor chips are on a same side of the interposer. While each of the sensor chips 208A, 208B, 208C may be identical, in advantageous embodiments, the sensor chips are at least of a different manufacture and preferably also of different function. In an embodiment, at least one of the sensor chips 208A, 208B, 208C requires a cavity 207 to function. In one such embodiment, at least one of the sensor chips 208A, 208B, 208C includes micro-electro-mechanical system (MEMs) having a released structure that is anchored to the sensor chip substrate 101 in a manner which enables the released restructure to be physically displaced within the cavity 207 relative to the sensor chip substrate 101. For example, the first sensor chip 208A may include any MEMs accelerometer known in the art and as embodiments of the present invention are not limited in this respect, no further description is provided herein. In a further embodiment, the second sensor chip 208B entails a second MEMs device with a function other than an accelerometer. In the exemplary embodiment, the second sensor chip 208B, including any MEMs gyroscope known in the art, is joined to the interposer 201 by the hermetic seal 210B, which may be of the same or different structure than the hermetic seal 210A. The third sensor chip 208C may be any other MEMs-based or non-MEMs sensor known in the art. In the exemplary embodiment, the third sensor chip 208C, including any MEMs resonate known in the art, is joined to the interposer 201 by the hermetic seal 210C, which may be of the same or different structure than the hermetic seals 210A and 210B.

In an embodiment, the interposer 201 includes lateral electrical interconnect traces 251 to electrically couple together one or more of the first, second, and third sensor chips 208A, 208B, 208C to each other and/or to an IC chip affixed to the first interposer side 202, and/or to electrically couple the first IC chip 205A to a second IC chip 205B affixed to the second interposer side 203. The lateral electric interconnect traces 251 may further rout electrical traces from all devices affixed to the interposer 201 to electrical connections 232 which in the exemplary embodiment are directly affixed to a PCB 260 to form the integrated system 200. In an alternative embodiment, the electrical connections 232 are affixed to an organic package substrate (not depicted) which is then affixed to the PCB 260. In either implementation, the lateral electrical interconnect traces 251 may be of copper or aluminum, etc. if conventional wafer-level thin film fabrication techniques are used, or advantageously of an anisotropic conductive adhesive (ACA) which is laminated or printed onto the interposer 201 if LCD fabrication techniques are used. ACA techniques include anisotropic conductive films (ACF), anisotropic conductive pastes (ACP), and the like. The lateral electrical interconnect traces 251 may be of any ACA material known in the art of liquid crystal displays(LCD) or thin film transistors (TFT). The lateral interconnect traces 251 are formed in dielectric layers 240 and 241 deposited on the interposer 201. The dielectric layers 240 and 241 may be for example silicon dioxide, or preferably silicon nitride which forms a hermetic barrier at lower thicknesses than silicon dioxide.

In an embodiment, the interposer 201 is a glass of 100-500 μm in thickness. Generally, any glass known to be suitable for LCD applications may be utilized, with the exemplary interposer 201 being of boro-aluminasilicate glass. Such LCD glass embodiments have a coefficient of thermal expansion (CTE) well-matched to that of the sensor chips 208A, 208B, 208C and IC chips 205A, 205B. LCD glass materials are also inexpensive relative to many other potential interposer materials, such as silicon. As described elsewhere herein, LCD glass is also amenable to the formation of the through vias 250A, 250B, allowing vertical electrical interconnects to be formed at a lower cost that TSV requiring ablation and/or deep silicon plasma etch processes. LCD glass is also a low contaminant material which provides a good hermetic seal for the sensor chips 208A, 208B, and 208C.

With the general architecture and materials employed in embodiments of the present invention exemplified by the integrated system 200. FIGS. 3A, 3B, 3C, and 3D are cross-sectional illustrations further depicting electrical and hermetic bonding structures which may be employed in accordance embodiments of the present invention. As previously described, it is possible to mix sensor chips and IC chips on the same side of the interposer as it is possible to mix the assembly bonding sequence. However, in advantageous embodiments, sensor chips needing a hermetic cavity are disposed on one interposer surface (side) and the IC chips are disposed on the opposite interposer surface (side). Such embodiments enable the hermetic cavities to be bonded to a very clean surface (e.g., glass), for example first in a bonding sequence under clean conditions. In exemplary embodiments illustrated in FIGS. 3A, 3B, 3C, and 3D, the hermetic seals to the interposer are flux-less. In further embodiments where the sensor is highly sensitive to contaminants, the bonding material has a low vapor pressure at the bonding temperature.

Figure 3A:
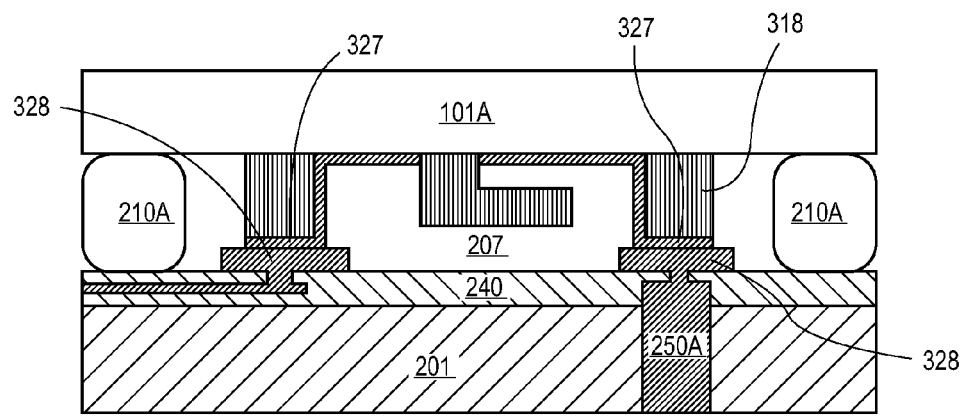
FIGS. 3A, 3B, 3C, and 3D are cross-sectional illustrations of electrical and hermetic bonding structures, in accordance embodiments of the present invention.

In a first embodiment, illustrated in FIG. 3A, electrical connections are achieved with direct metal compression bonding between sensor pads 327 and interposer pads 328, each of which may be of gold (Au) or copper (Cu) for example, to form a joint of essentially Au or Cu. One or more of the interposer pads 328 may be directly coupled to the through via 250A. As further shown in FIG. 3A, the hermetic seal 210A is achieved with a continuous ring of glass frit. Glass frit has the advantage of being bondable directly to the bulk surface (i.e., no pad) of the sensor chip and the interposer (having a glass or other dielectric surface). In the exemplary embodiment the sensor pads 327 are disposed on a pedestal 318 to standoff the sensor chip sufficiently to accommodate the hermetic seal 210A. In alternate embodiments, a the pedestal 318 may be disposed on the interposer 201 to accommodate sensors chips from different sources and/or of structure. More generally, any of the hermetic seal 210A, pads 327, 328 may be disposed on a mechanical stand-off as needed.

Figure 3B:
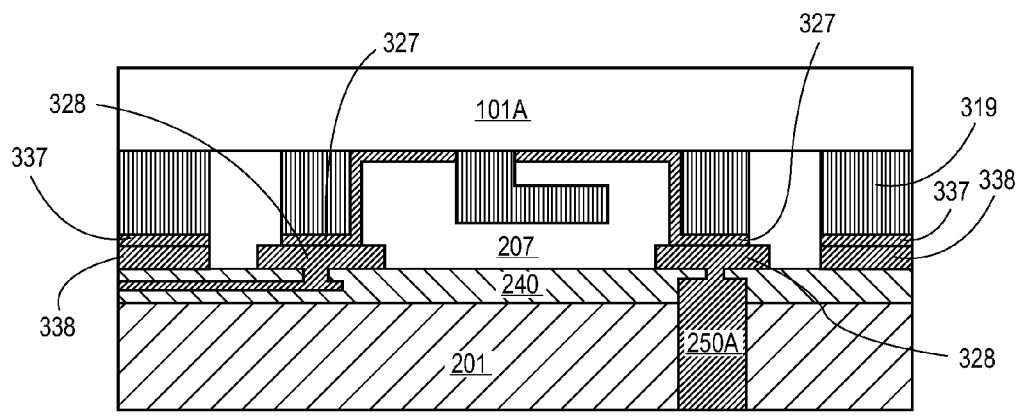

In a second embodiment, illustrated in FIG. 3B, both electrical connections and a hermetic seal are provided by a metal-metal compression bond. For this embodiment, both a sensor metal ring pad 337 and an interposer metal ring pad 338 are joined to form a joint, of essentially Au or Cu for example, that continuously surrounds the sensor 105 and seals the cavity 207. Like the individual electrical connections, the sensor metal ring pad 337 is disposed on a pedestal 319, though interposer metal ring pad 338 may also be disposed on a standoff in combination with, or in place of pedestal 319. Along with the compression bonded Au—Au or Cu—Cu hermetic seal, the electrical connections including the sensor pads 327 and interposer pads 328 are compression bonded Au—Au or Cu—Cu, as described for the embodiment in FIG. 3A.

Figure 3C:
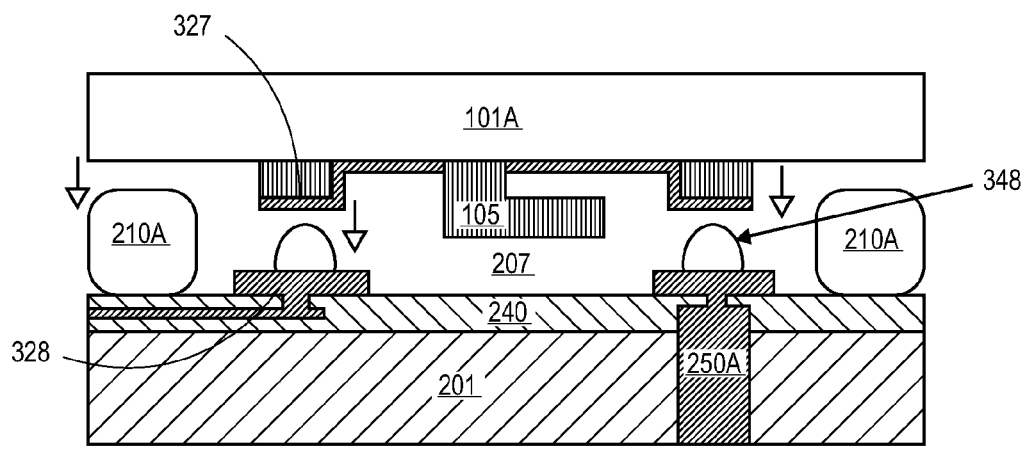

In a third embodiment, illustrated in FIG. 3C, the electrical connections include a solder joint 348 coupling the sensor pad 327 to the interposer pad 328, while the hermetic seal 210A is of glass frit. In this embodiment, the solder is preferably deposited using conventional techniques (e.g., plated, microball, solder paste, reflow, etc.) on the interposer 201 with the sensor pads 327 finished with a metal coating that minimizes oxidation (so that flux may be avoided) and is compatible with the chosen solder. In particular embodiments, the sensor pads 327 include at least one of Au, Pt or Pd.

Figure 3D:
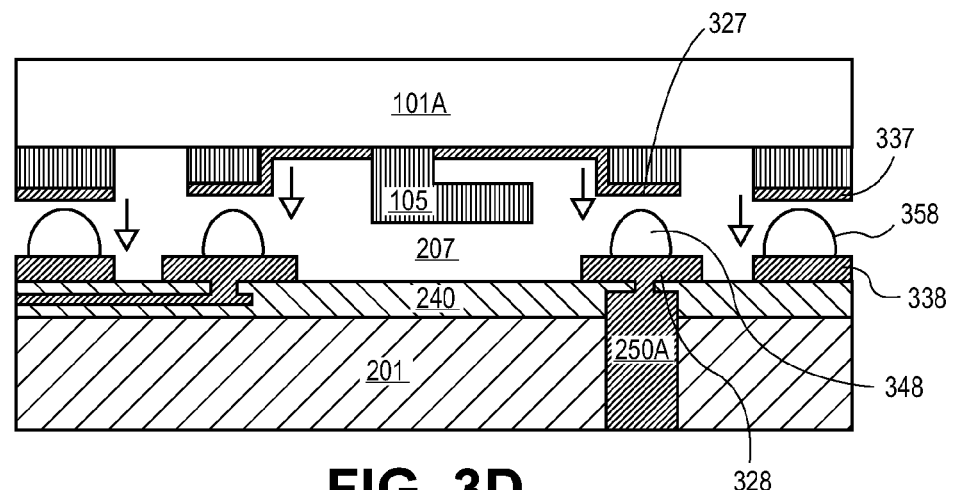

In a fourth embodiment, illustrated in FIG. 3D, both the electrical connections and the hermetic seal include solder joints 348, 358, respectively. Such solder embodiments advantageously relax flatness or leveling constraints relative to compression bonded embodiments. Like for the compression bonded embodiments, solder seal rings include both a sensor metal ring pad 337 and an interposer metal ring pad 338. A solder joint 358 joining the sensor metal ring pad 337 and an interposer metal ring pad 338 is preferably of a same solder composition as the electrical solder joint 348.

Figure 4A:
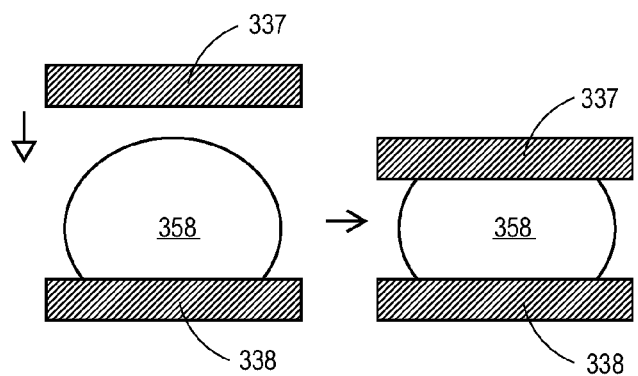
FIGS. 4A and 4B are cross-sectional illustration of solder joints, in accordance with embodiments of the present invention.
Figure 4B:
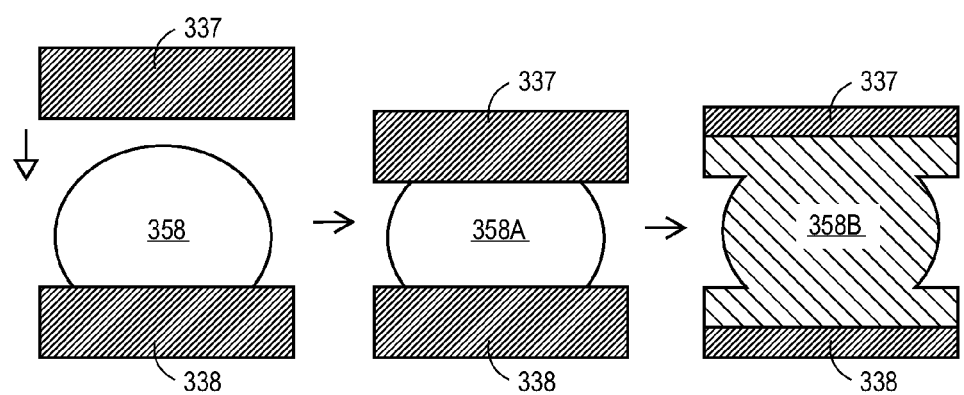

Embodiments employing solder joints coupling the sensor chip to the interposer may employ different types of solder. FIGS. 4A and 4B are cross-sectional illustration of solder joints, in accordance with two such embodiments. In a first embodiment, illustrated in FIG. 4A, a solder joint 358 bonding a sensor chip to an interposer is of a fixed solder composition having a sufficiently high melting temperature that subsequent solder bonds between the interposer and an IC chip and/or PCB (e.g., electrical connections 222A and 232) made with a solder composition having a lower melting temperature are not detrimental to the solder joint 358. For embodiments employing a plurality of sensor chips on a single interposer, the same solder composition may be utilized for all sensor chips. As illustrated by FIG. 4A, the sensor pad 337 and interposer pad 338 merely serve as mechanical substrates for the solder joint 358 with minimal solder-pad reactions so that the bulk composition of the solder joint 358 is the substantially the same as the composition of the metallic alloy constituents in the as-deposited solder. Exemplary, high temperature solder alloys which may be employed include, but are not limited to, cadmium-silver binary alloys (e.g., Cd95Ag5), zinc-tin binary alloys (e.g., Zn95Sn5), gold-silicon binary alloys (Au96.8Si3.2), gold-germanium binary alloys (e.g., Au87.5Ge12.5), and gold-indium binary alloys (e.g., Au82In18). 12.

For such embodiments, in the integrated system 200 (FIG. 2), the hermetic seal 210A and/or the electrical connections 212A to the interposer 201 may be with first solder joints having the high melting temperature composition while the first IC chip 205A is physically attached to the interposer 201 by electrical connections 222A that include second solder joints of a lower melting temperature composition (e.g., a binary SnAg alloy).

In a second embodiment, illustrated in FIG. 4B, a solder joint 358 bonding a sensor chip to an interposer is of a reactive solder. The solder joint 358 has a composition with a low melting temperature, but reacts to form an intermetallic compound or solid solution having a sufficiently higher melting temperature that subsequent solder bonds between the interposer and an IC chip and/or PCB (e.g., electrical connections 222A and 232) are not detrimental to the solder joint 358. As illustrated by FIG. 4B, the sensor pad 337 and interposer pad 338 react during bonding to form a solder joint 358A having a composition that is includes constituents from both the pads 337, 338 and the solder as-deposited. After higher temperature annealing, a full solder-pad reaction achieves the intermetallic or solid solution 358B. Exemplary, low temperature solder alloys which may be employed to form such intermetallic or solid solutions include, but are not limited to, indium (In) and its alloys. For the exemplary In solder and Cu pads 337, 338, a solid solution of CuxIn1-x having a high melting temperature than In is formed. For the exemplary In solder and Au pads 337, 338, a solid solution of AuxIn1-x having a high melting temperature than In is formed.

For such embodiments, in the integrated system 200 (FIG. 2), the hermetic seal 210A and/or the electrical connections 212A to the interposer 201 may be with first solder joints having the reacted intermetallic composition while the first IC chip 205A is physically attached to the interposer 201 by electrical connections 222A that include second solder joints of a lower melting temperature composition (e.g., a binary SnAg alloy).

Figure 5A:
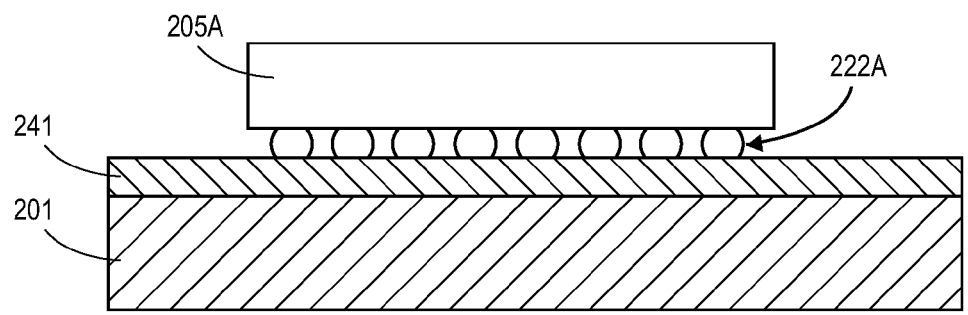
FIGS. 5A and 5B are cross-sectional illustrations of a flip-chip bonded IC chip with and without underfill, in accordance with embodiments of the present invention.
Figure 5B:
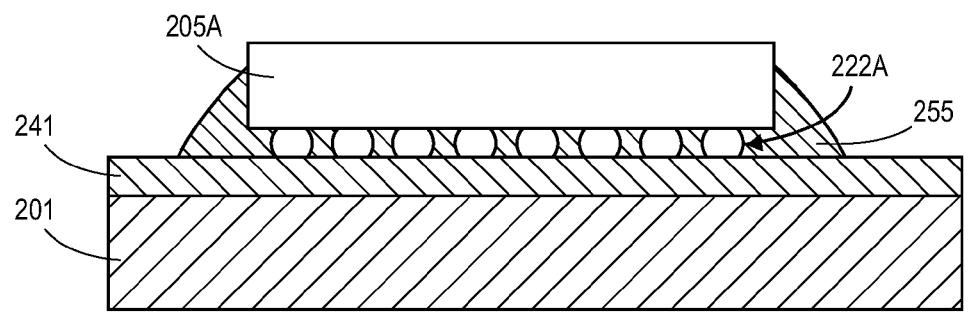

Depending on the embodiment, IC chips may be bonded to the interposer with or without underfill. FIGS. 5A is cross-sectional illustration of the first IC chip 205A flip-chip bonded to an interposer 201 without underfill (e.g., voids between the electrical connections 222A. FIG. 5B is a cross-sectional illustration of the first IC chip 205A flip-chip bonded to the interposer 201 with underfill 255 between the electrical connections 222A. The underfill 255 may not be needed from a mechanical perspective for glass interposer embodiments because the CTE mismatch between the interposer and IC chip (substantially silicon) is small. To achieve this simplification in the architecture however, the IC chip should be bonded with a solder having composition with a high melting temperature than for the solder composition employed for subsequent bonding of the interposer (e.g. to a PCB) so that the electrical connections 222A are not disrupted during the subsequent solder reflows. For embodiments where a higher temperature solder composition is utilized for attachment of the sensor chip therefore, three solder compositions having three melting temperatures are be utilized. For example, in the embodiment illustrated in FIG. 2, electrical connections 212A, 212B 212C and/or hermetic seals 210A, 210B, 210C include first solder joint of a first composition having a highest melting temperature, electrical connections 222A include a second solder of a second composition having an intermediate melting temperature, and electrical connections 232 include a third solder joint of a third composition having a melting temperature lower than a that of both a first and second solder joints.

Figure 6:
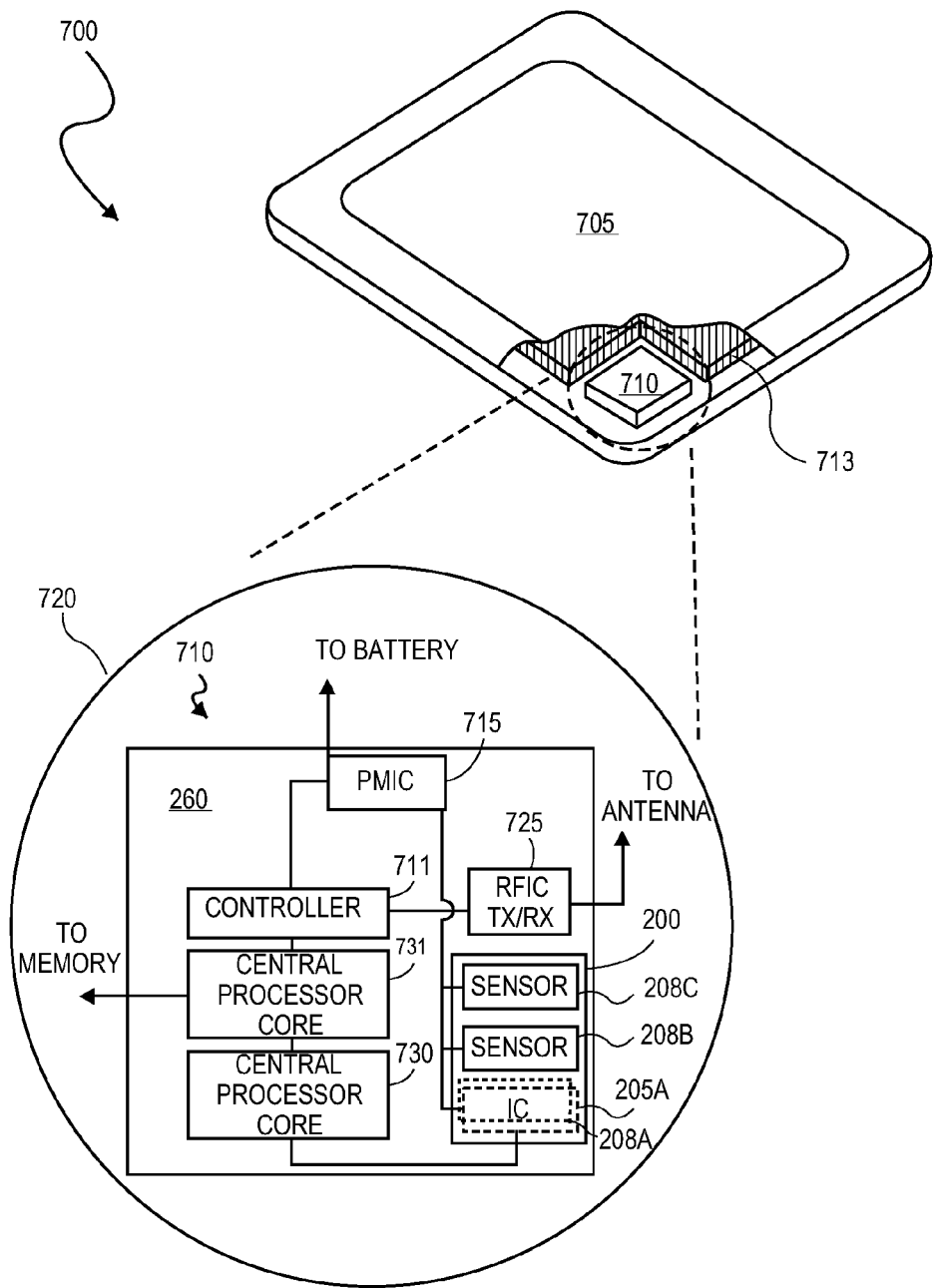
FIG. 6 is a functional block diagram of a mobile computing platform employing sensor chips and IC chips integrated on an interposer, in accordance with an embodiment of the present invention.

FIG. 6 is a functional block diagram of a mobile computing platform 700 which employs the integrated system 200, in accordance with an embodiment of the present invention. The mobile computing platform 700 may be any portable device configured for each of electronic data display, electronic data processing, and wireless electronic data transmission. For example, mobile computing platform 700 may be any of a tablet, a smart phone, laptop computer, etc. and includes a display screen 705 which in the exemplary embodiment is a touchscreen (capacitive, inductive, resistive, etc.), the board-level integrated device 710, and a battery 713. As illustrated, the greater the level of integration of the board-level integrated device 710, the greater the portion of the mobile computing device 700 that may be occupied by the battery 713 or a memory (not depicted), such as a solid state drive, for greatest platform functionality. As such, the ability to integrate sensor chips with IC chips on an interposer disposed directly on a PCB, as described herein, enables further performance and form factor improvements of the mobile computing platform 700.

The board-level integrated device 710 is further illustrated in the expanded view 720. Depending on the embodiment, the board-level integrated device 710 includes the PCB 260 upon one or more of a power management integrated circuit (PMIC) 715, RF integrated circuit (RFIC) 725 including an RF transmitter and/or receiver, a controller thereof 711, and one or more central processor cores 730, 731 for processing input received integrated with the integrated system 200. Functionally, the PMIC 715 performs battery power regulation, DC-to-DC conversion, etc., and so has an input coupled to the battery 713 and has an output provide a current supply to all the other functional modules in the board-level integrated device 710, including, for example, the first IC 205A and/or the sensor 208A in the integrated system 200. As further illustrated, in the exemplary embodiment the RFIC 725 has an output coupled to an antenna to provide a carrier frequency of around 2 GHz (e.g., a 1.9 GHz in an RFIC 725 designed for 3G or GSM cellular communication) and may further have an input coupled to a communication modules on the board-level integrated device 710, such as an RF analog and digital baseband module (not depicted).

FIGS. 7 and 8A-8C are flow diagrams illustrating methods of integrating sensor chips and IC chips on an interposer, in accordance with embodiments of the present invention. The method 800 in FIG. 7 begins with operation 810 where each of an interposer, one or more sensor chips and one or more IC chips are received. In one embodiment, the sensor chips are received from a source as one of many unencapsulated sensors still in wafer form with sensor chip singulation to be performed as part of operation 810. At operation 820, all sensor chips to be integrated onto the interposer are affixed to one or both sides of the interposer. In the exemplary embodiment, all sensor chips to be integrated onto the interposer are affixed to bond pads on the interpose that are disposed on a same, first side of the interposer. At operation 850, all the IC chips to be integrated onto the interposer are affixed to the interposer, for example on the second side of the interposer, by bonding them to at least one bond pad that is electrically coupled to a through via in the interposer which is further coupled to at least one bond pad on the first side of the interposer that is coupled to a sensor chip. At operation 895, the interposer is attached, for example by solder bumps, to an organic package substrate or directly to a PCB.

Figure 8A:
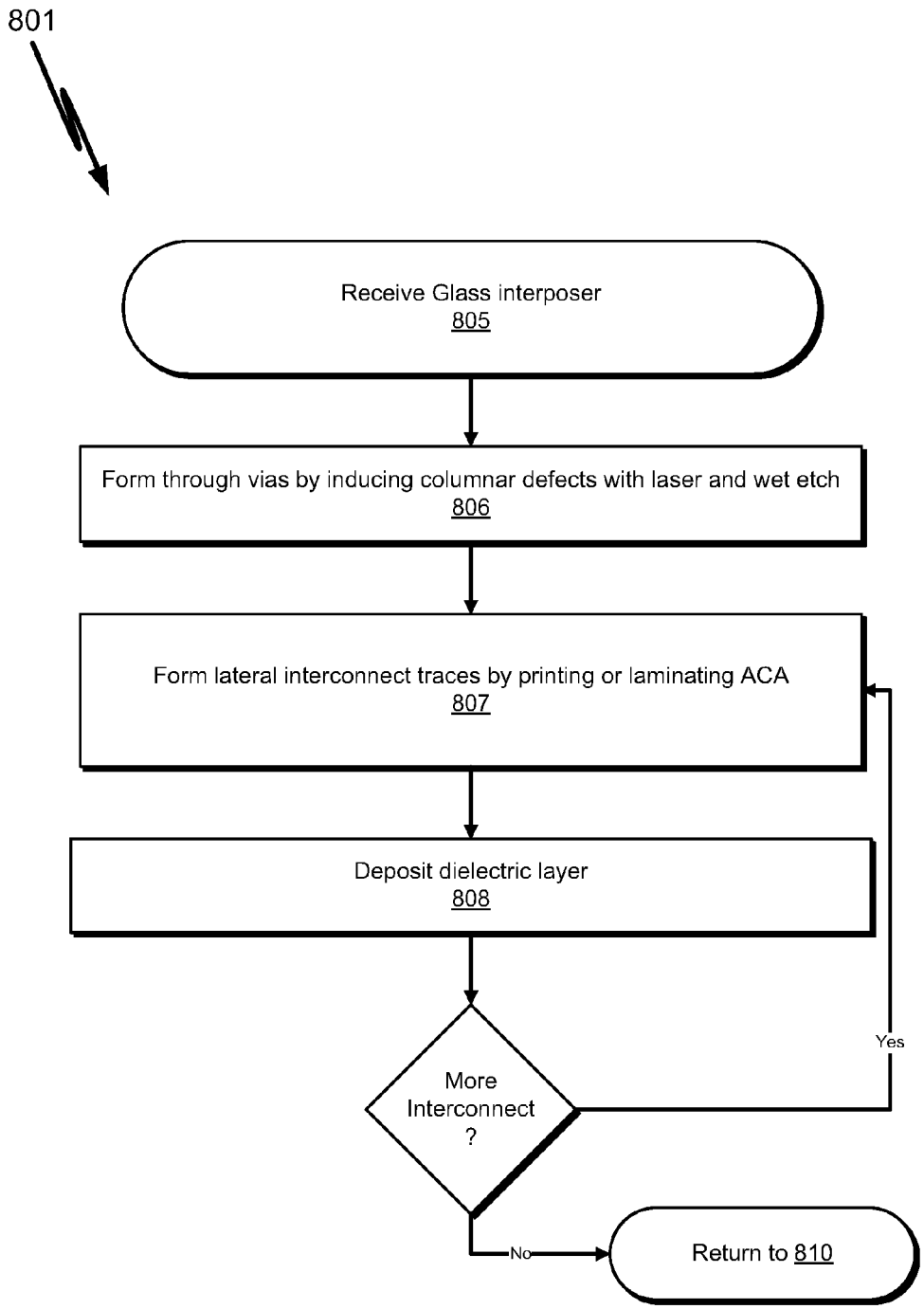

FIG. 8A further illustrates a method 801 for forming an interposer which may be employed in the method 800, in accordance with an embodiment. Method 801 begins at operation 805 with receipt of a glass interposer substrate. At operation 806 columnar defects are induced within the glass at predetermined locations where through vias are to be provided. The columnar defects are in one embodiment formed through exposure to laser radiation of a desired energy for a desired time. The glass interposer is then submerged in a wet etchant solution which selectively etches the regions of the glass interposer having the columnar defects thereby opening through vias in the glass interposer. Conventional plating techniques are then used to form vertical electrical interconnects. At operation 807 lateral interconnect traces are formed by printing or laminating an anisotropic conductive adhesive (ACA). For example, an anisotropic conductive paste is printed on the glass interposer and cured or an anisotropic conductive film is laminated on the glass interposer. At operation 808, dielectric layers are built up on one or both sides of the glass interposer by thin film deposition techniques (e.g., chemical vapor deposition) or by spin on coating techniques (e.g., spin on glass, etc.). Operations 807 and 808 are repeated until a predetermined number of lateral interconnect layers are formed. The method 801 then returns to operation 810 of method 800.

Figure 7:
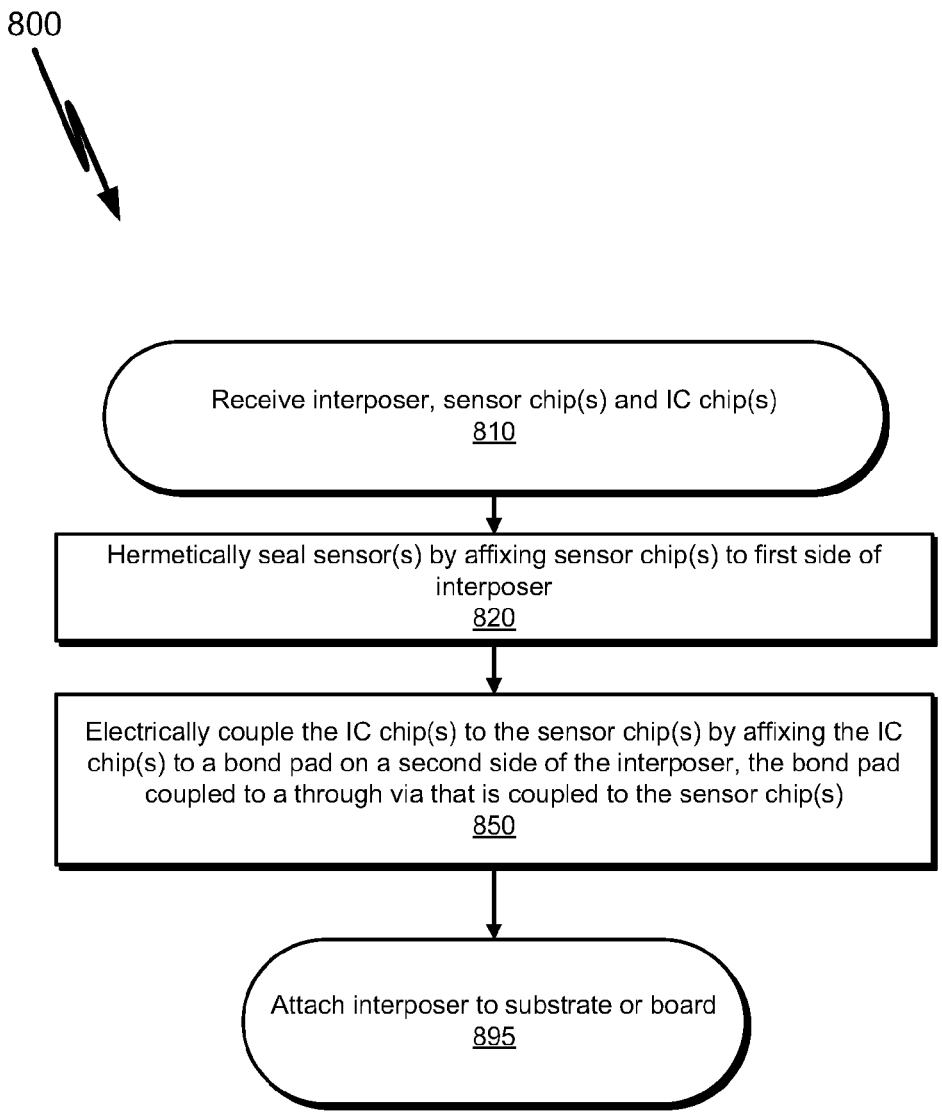
Figure 8B:
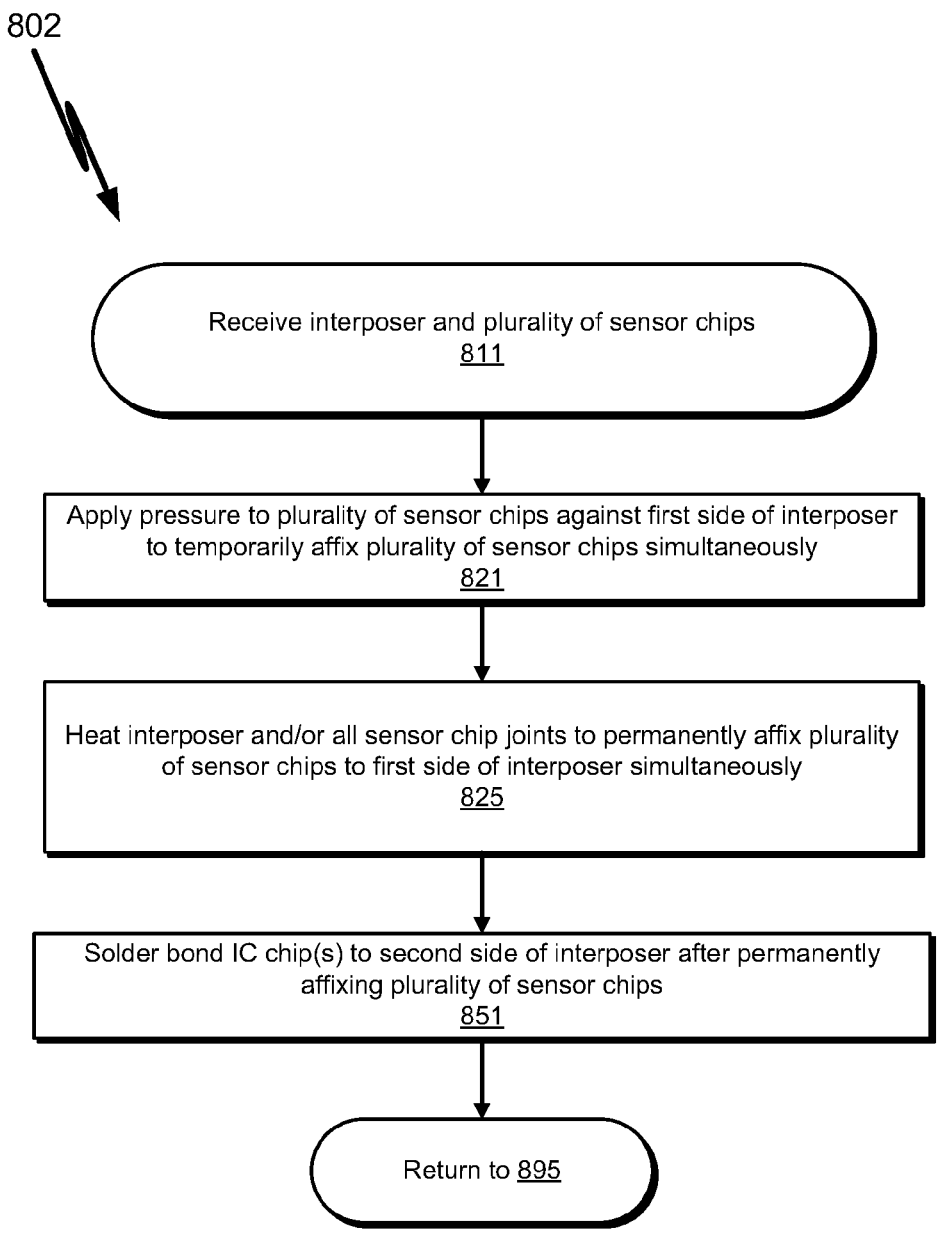

FIG. 8B illustrates a method 802 further describing specific embodiments of the operations 820 and 850 in the method 800. Method 802 begins at operation 811 with receipt of a plurality of sensor chips and an interposer, for example the glass interposer formed by method 801. At operation 821, pressure is applied to the plurality of sensor chips to hold each sensor chip that is to be integrated onto the interposer against a first side of the interposer. In the exemplary embodiment the pressure applied is light, merely to keep the sensor chips in physical contact with the interposer. At operation 825 heat is applied either locally to each sensor chip or globally across the entire interposer to cause solder bumps present between the each sensor chip and the interposer to join. In an alternative embodiment with direct pad-pad metal bonding, operations 821 and 825 are performed in the absence of solder and at higher pressure and/or temperatures. After permanently affixing the plurality of sensor chips to the interposer, the solder chip(s) are affixed to the second side of the interposer at operation 851, for example with any flip-chip (C4) bonding technique known in the art. Method 802 then returns to operation 895 (FIG. 7).

FIG. 8C illustrates a method 803 further describing specific embodiments of the operations 821 and 851 in the method 802. Method 803 begins at operation 822 where bond pads of the interpose (e.g., on a first side) are joined to bond pads of each of the plurality of sensor chips with a first solder joint at a first solder temperature. At operation 852, bond pads of the interposer (e.g., on a second side) are joined to bond pads of the IC chip(s) with a second solder joint at a second soldering temperature which does not cause the first solder joint to reflow. In a first embodiment where the first solder joint comprises a solder which forms an intermetallic with the bond pads, the first soldering temperature and the second soldering temperature are approximately the same. In a second embodiment, where the first solder joint comprises a solder which does not form an intermetallic with the bond pads, the first soldering temperature is higher than the second soldering temperature. Method 803 then returns to operation 895 where, if the IC chip is not underfilled, bond pads of the interposer (e.g., on the second side) are joined to bond pads on a package substrate or PCB with a third solder joint at a third soldering temperature that is lower than both the first and second soldering temperatures of operations 822 and 852.

It is to be understood that the above description is illustrative, and not restrictive. For example, while flow diagrams in the figures show a particular order of operations performed by certain embodiments of the invention, it should be understood that such order may not be required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A method of packaging a microelectronic device, the method comprising:

hermetically sealing a first sensor within a first cavity by affixing a first sensor chip to a first side of an interposer;

hermetically sealing a second sensor within a second cavity by affixing a second sensor chip to the first side of the interposer; and electrically coupling an integrated circuit (IC) chip to the first sensor by affixing the IC chip to a second side of the interposer, opposite the first sensor chip, the interposer including a through via electrically connecting the first and second sides of the interposer, wherein the first sensor comprises a first micro-electro-mechanical system including a mechanically displaceable structure anchored to the first sensor chip.

2. The method of claim 1, wherein affixing a first sensor chip to the first side of the interposer and affixing a second sensor chip to the interposer further comprises:

simultaneously applying a pressure to both the first and second sensor chips against the interposer, and heating the interposer to permanently affix the first and second sensor chips.

3. The method of claim 1, wherein affixing the IC chip to a second side of the interposer further comprises solder bonding the IC chip after affixing the first and second sensor chips to the interposer.

4. The method of claim 3, wherein affixing the first and second sensor chips to the interposer further comprises joining bond pads of the interposer to bond pads of the first and second sensor chips with a first solder joint at a first soldering temperature; and wherein affixing the IC chip to the interposer further comprises joining bond pads of the interposer to bond pads of the IC chip with a second solder joint at a second soldering temperature which does not cause the first solder joint to reflow.

5. The method of claim 4, wherein joining bond pads of the interposer to bond pads of the first and second sensor chips with the first solder joint further comprises forming the first solder joint with a high temperature solder composition; and wherein joining bond pads of the interposer to bond pads of the IC chip with the second solder joint further comprises forming the second solder joint with a low temperature solder composition.

6. The method of claim 4, wherein joining bond pads of the interposer to bond pads of the first and second sensor chips with the first solder joint further comprises forming the first solder joint with a low temperature solder composition and annealing the first solder joint to form a intermetallic compound having a higher melting temperature than the first soldering temperature; and wherein joining bond pads of the interposer to bond pads of the IC chip with the second solder joint further comprises forming the second solder joint with a low temperature solder composition.

7. The method of claim 1, further comprising:

forming lateral electrical interconnect traces across at least one of the first and second sides of the interposer to electrically couple a first interposer bond pad affixed to at least one of: the IC chip, the first sensor chip, and the second sensor chip to a second interposer bond pad to be affixed to a printed circuit board (PCB).

8. The method of claim 7, wherein forming lateral electrical interconnect traces further comprises an anisotropic conductive adhesive (ACA) process including printing or lamination of the ACA or further comprises a semiconductor wafer interconnect process sequence including dielectric film deposition, dielectric film etching, and metal trace plating.

* * * * *